US009265185B2

(12) United States Patent
Mao (10) Patent No.: US 9,265,185 B2
(45) Date of Patent: Feb. 16, 2016

(54) ELECTRONIC DEVICE, ASSEMBLING STRUCTURE AND ASSEMBLING METHOD

(71) Applicant: Wistron Corporation, New Taipei (TW)

(72) Inventor: Zhong-Hui Mao, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 14/249,359

(22) Filed: Apr. 10, 2014

(65) Prior Publication Data

US 2015/0181730 A1 Jun. 25, 2015

(30) Foreign Application Priority Data

Dec. 19, 2013 (CN) .......................... 2013 1 0705899

(51) Int. Cl.
*H05K 5/00* (2006.01)
*H05K 13/00* (2006.01)
*H05K 5/03* (2006.01)

(52) U.S. Cl.
CPC ................ *H05K 13/00* (2013.01); *H05K 5/03* (2013.01); *Y10T 29/49826* (2015.01)

(58) Field of Classification Search
CPC ....... G06F 1/187; G06F 1/181; G06F 1/1679; G11B 33/124; G11B 33/027; H05K 5/0217; H05K 5/0208; H05K 7/14; H05K 7/183; E05B 65/006; E05C 9/02
USPC ............ 312/223.2, 223.1; 292/137, 138, 163, 292/174, DIG. 37, DIG. 11; 361/679.57, 361/679.58
See application file for complete search history.

(56) References Cited

U.S. PATENT DOCUMENTS

| 4,142,329 | A | * | 3/1979 | Williams | 49/465 |
| 5,924,782 | A | * | 7/1999 | Park | 312/328 |
| 5,926,916 | A | * | 7/1999 | Lee et al. | 16/230 |
| 6,109,710 | A | * | 8/2000 | Wu et al. | 312/223.2 |

(Continued)

FOREIGN PATENT DOCUMENTS

| EP | 1505230 A1 | 2/2005 |
| TW | 200945995 | 11/2009 |

OTHER PUBLICATIONS

"Office Action of Taiwan Counterpart Application", issued on Oct. 27, 2015, with English translation thereof, p1-p13, in which the listed references were cited.

*Primary Examiner* — Janet M Wilkens
(74) *Attorney, Agent, or Firm* — Jianq Chyun IP Office (57) ABSTRACT

An electronic device including a main body, a cover and an assembling structure is provided. The main body has two first positioning structures. The assembling structure includes two sliding components, two second positioning components and two elastic components. Each sliding component is slidably disposed on the cover and has a pressing portion. The second positioning structures are connected to the sliding components respectively and aligned to the first positioning components respectively. The elastic components are connected to the cover and connected to the sliding components respectively. Each second positioning component is positioned at the corresponding first positioning component by elastic force of the corresponding elastic component, so as to stop the cover separating from the main body. When the pressing portions receive forces at the same time to drive the second positioning structures to move away from the first positioning structures respectively, the cover is separated from the main body.

20 Claims, 12 Drawing Sheets

(56) References Cited

U.S. PATENT DOCUMENTS

| | | | |
|---|---|---|---|
| 6,729,662 B2 * | 5/2004 | Wang et al. | 292/42 |
| 7,152,443 B2 * | 12/2006 | Chang et al. | 70/352 |
| 7,585,005 B1 * | 9/2009 | Cote et al. | 292/38 |
| 8,248,790 B2 * | 8/2012 | Wang et al. | 361/679.58 |
| 8,322,533 B2 * | 12/2012 | Odashima et al. | 206/711 |
| 9,007,750 B2 * | 4/2015 | Tang et al. | 361/679.02 |
| 2005/0185370 A1 * | 8/2005 | Chung | 361/683 |
| 2005/0264142 A1 * | 12/2005 | Cunningham et al. | 312/223.2 |
| 2007/0115622 A1 * | 5/2007 | Zhang et al. | 361/683 |
| 2007/0120372 A1 * | 5/2007 | Zhang et al. | 292/8 |
| 2007/0205349 A1 * | 9/2007 | Fan et al. | 248/539 |
| 2008/0158808 A1 * | 7/2008 | Camarena et al. | 361/685 |
| 2011/0182026 A1 * | 7/2011 | Kang | 361/679.37 |

\* cited by examiner

Penetrate a sliding component and a positioning structure through a first section and a second section, and move the sliding component along an axial line until the positioning structure leans against a first physical portion of a second rib plate — S602

Rotate the sliding component along the axial line to move the positioning structure away from the first physical portion when the positioning structure leans against the first physical portion, and continually move the sliding component along the axial line to pass through a notch — S604

ELECTRONIC DEVICE, ASSEMBLING STRUCTURE AND ASSEMBLING METHOD

CROSS-REFERENCE TO RELATED APPLICATION

This application claims the priority benefit of China application serial no. 201310705899.2, filed on Dec. 19, 2013. The entirety of the above-mentioned patent application is hereby incorporated by reference herein and made a part of this specification.

BACKGROUND

1. Technical Field

The invention relates to an electronic device, an assembling structure and an assembling method. Particularly, the invention relates to an electronic device having a detachable cover and an assembling structure and an assembling method thereof.

2. Related Art

Along with quick development of electronic technology, various electronic products have been widely used in people's daily life. Besides focusing on performance of the electronic products, consumers also have requirements on appearance, safety and maintenance convenience, etc. of the electronic products.

Regarding networked attached storage (NAS) equipment, it generally has a cover for shielding internal structures thereof, so as to achieve a better appearance. In order to improve maintenance convenience of the NAS equipment, the cover of some of the NAS equipment are designed to be easily disassembled without using any tool, though such design results in a fact that the cover is easy to be unexpectedly dissembled to cause danger, for example, a child may disassemble the cover when casually operating the equipment to cause electric shock, scratch or scald, etc. If the NAS equipment is designed to be disassembled by using tools in order to avoid the above problem, the maintenance convenience thereof is decreased. Therefore, how to avoid the unexpected disassembling of the cover while maintaining the maintenance convenience of the equipment becomes an important issue in design of the equipment.

SUMMARY

The invention is directed to an electronic device, where a cover thereof is capable of being conveniently disassembled, and is avoided to be unexpectedly disassembled.

The invention provides an assembling structure, in which a cover of an electronic device is capable of being conveniently disassembled, and is avoided to be unexpectedly disassembled.

The invention provides an assembling method, which is adapted to assemble an assembling structure and a cover.

The invention provides an electronic device including a main body, a cover and an assembling structure. The main body has at least two first positioning structures. The assembling structure includes two sliding components, at least two second positioning structures and two elastic components. Each of the sliding components is slidably disposed on the cover and has a pressing portion. The two second positioning structures are respectively connected to the two sliding components and are respectively aligned to the two first positioning structures. The two elastic components are connected to the cover and are respectively connected to the two sliding components. Each of the second positioning structures is positioned at the corresponding first positioning structure by an elastic force of the corresponding elastic component, so as to stop the cover separating from the main body. When the two pressing portions bear forces at the same time to drive the two second positioning structures to respectively move away from the two first positioning structures, the cover is adapted to separate from the main body.

The invention provides an assembling structure adapted to an electronic device. The electronic device includes a main body and a cover. The main body has at least two first positioning structures. The assembling structure includes two sliding components, at least two second positioning structures and two elastic components. Each of the sliding components is slidably disposed on the cover and has a pressing portion. The two second positioning structures are respectively connected to the two sliding components and are respectively aligned to the two first positioning structures. The two elastic components are connected to the cover and are respectively connected to the two sliding components. Each of the second positioning structures is positioned at the corresponding first positioning structure by an elastic force of the corresponding elastic component, so as to stop the cover separating from the main body. When the two pressing portions bear forces at the same time to drive the two second positioning structures to respectively move away from the two first positioning structures, the cover is adapted to separate from the main body.

In an embodiment of the invention, each of the sliding components is slidably disposed on the cover along a first axis, the cover is adapted to separate from the main body along a second axis, where the first axis is perpendicular to the second axis.

In an embodiment of the invention, each of the first positioning structures is a positioning hole, and each of the second positioning structures is a positioning post.

In an embodiment of the invention, the assembling structure further includes two first rib plates, each of the first rib plates is connected to the cover and has a first opening, and the two sliding components respectively penetrate through the two first openings.

In an embodiment of the invention, the assembling structure further includes at least one second rib plate. The second rib plate has two notches, and the two notches are respectively aligned to the two first openings, and the two sliding components are respectively limited at the two notches.

In an embodiment of the invention, the assembling structure further includes at least one third rib plate. The third rib plate has two second opening, the two second openings are respectively aligned to the two first openings, and the two sliding components respectively penetrate through the two second openings.

In an embodiment of the invention, each of the first openings includes a first section and a second section connected to each other, where an outer diameter of the first section is greater than or equal to an outer diameter of each of the sliding components, and an outer diameter of the second section is smaller than the outer diameter of each of the sliding components and is greater than or equal to an outer diameter of each of the second positioning structures.

In an embodiment of the invention, each of the sliding components has a stop portion. A distance between the stop portion and the pressing portion is greater than a thickness of the first rib plate, and the first rib plate is located between the stop portion and the pressing portion to limit a moving range of the sliding component.

In an embodiment of the invention, each of the sliding components penetrates through the first opening along a first axis, each of the first rib plates has an orientation slot, where the orientation slot is connected to the first opening, and each of the sliding components has an orientation ridge, and the orientation ridge is engaged to the orientation slot to stop rotation of the sliding component along the first axis.

In an embodiment of the invention, the cover has two protrusion portions respectively aligned to the two elastic components, and each of the elastic components is compressed between the corresponding protrusion portion and the corresponding sliding component.

The invention provides an assembling method adapted to assemble a sliding component to a cover, where a first rib plate is connected to the cover and has a first opening, a second rib plate is connected to the cover and has a notch, a positioning structure is connected to the sliding component, and an axis passes through the first opening and the notch. The assembling method includes following steps. The sliding component and the positioning structure penetrate through the first opening, and the sliding component is moved along the axis until the positioning structure leans against a first physical entity of the second rib plate. When the positioning structure leans against the first physical entity, the sliding component is rotated along the axis to move the positioning structure away from the first physical entity, and the sliding component is continually moved along the axis to pass through the notch.

In an embodiment of the invention, a third rib plate is connected to the cover and has a second opening, and the axis passes through the second opening. The assembling method further includes following steps. When the sliding component passes through the notch and leans against a second physical entity of the third rib plate, the sliding component is rotated along the axis so that the positioning structure moves away from the second physical entity and is aligned to the second opening, and the sliding component is continually moved along the axis so that the sliding component and the positioning structure pass through the second opening.

According to the above description, in the electronic device of the invention, the main body has two first positioning structures, the assembling structure has two second positioning structures, and the two second positioning structures are adapted to be simultaneously positioned at the two first positioning structures to assemble the cover to the main body. The user is capable of moving the two second positioning structures away from the two first positioning structures by only pressing the two pressing portions on the two sliding components at the same time, so as to conveniently disassemble the cover. Moreover, when the user unintentionally presses one of the two pressing portions, only one of the two second positioning structures is moved away from the corresponding first positioning structure without moving the other second positioning structure away from the corresponding first positioning structure, by which the cover is effectively prevented from being unexpectedly dissembled to cause danger.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION OF DISCLOSED EMBODIMENTS

Figure 1:
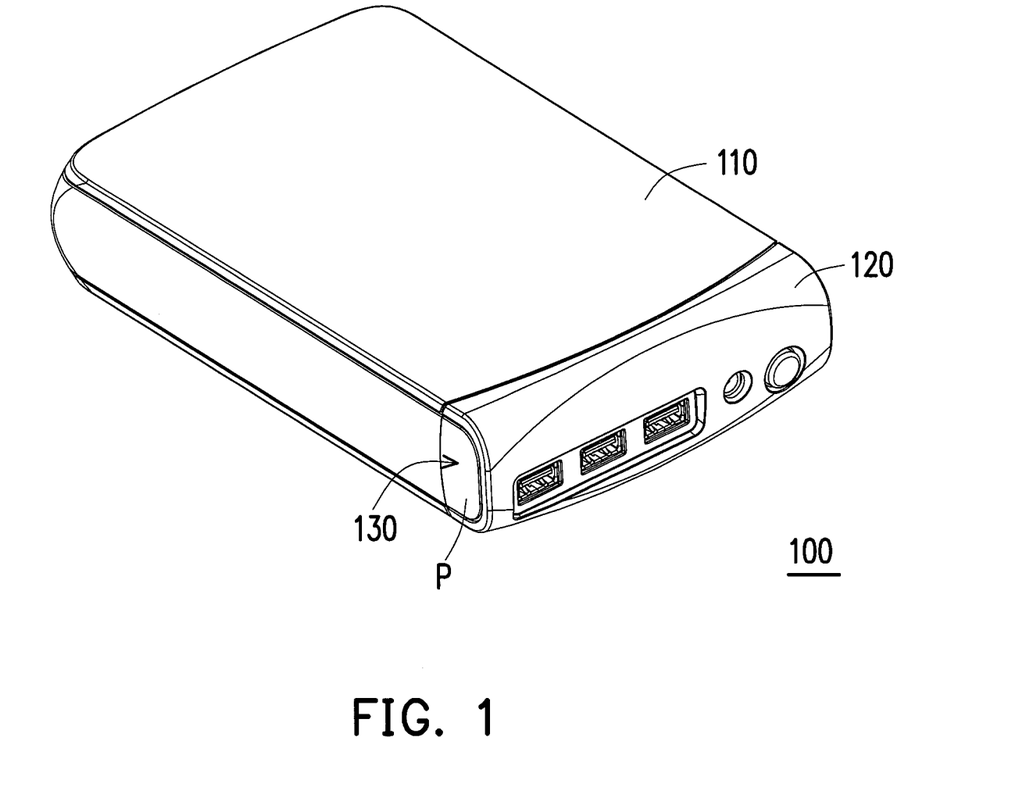
FIG. 1 is a three-dimensional view of an electronic device according to an embodiment of the invention.
Figure 2:
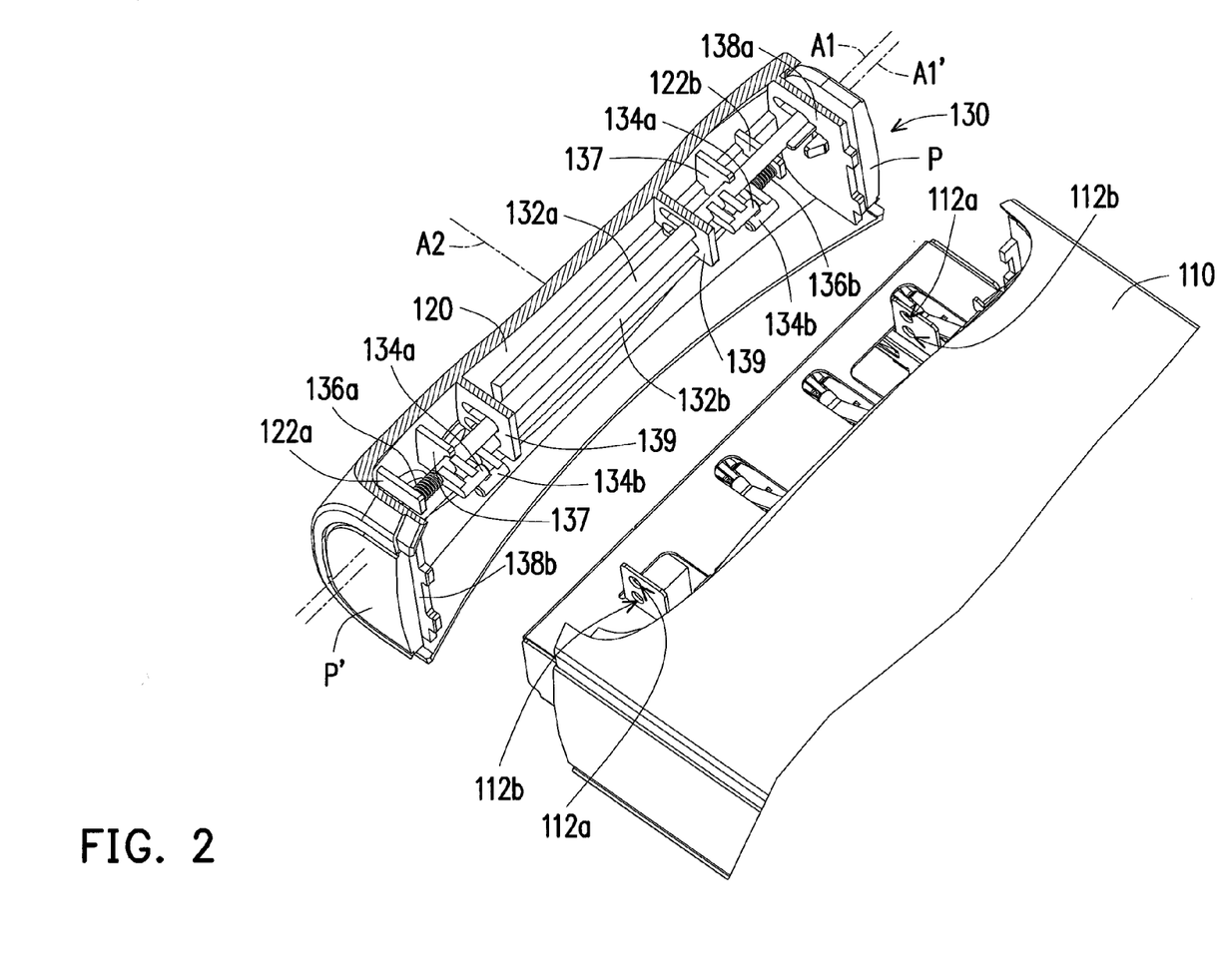
FIG. 2 is a partial exploded view of the electronic device of FIG. 1.
Figure 3:
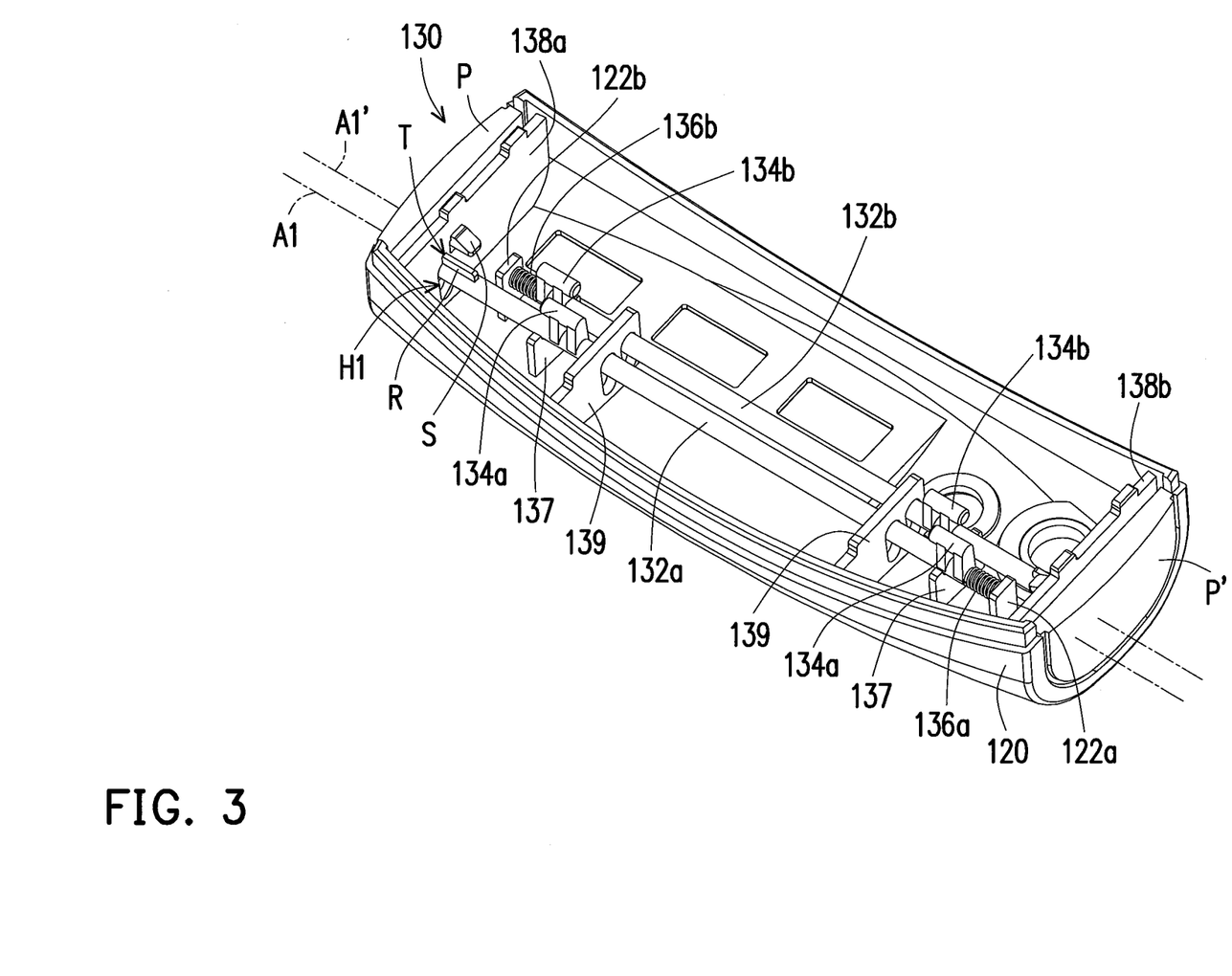
FIG. 3 is a three-dimensional view of a cover and an assembling structure of the electronic device of FIG. 1.

FIG. 1 is a three-dimensional view of an electronic device according to an embodiment of the invention. FIG. 2 is a partial exploded view of the electronic device of FIG. 1. FIG. 3 is a three-dimensional view of a cover and an assembling structure of the electronic device of FIG. 1. Referring to FIG. 1 to FIG. 3, the electronic device 100 of the present embodiment is, for example, networked attached storage (NAS) equipment and includes a main body 110, a cover 120 and an assembling structure 130. The main body 110 has at least one first positioning structure 112a (two first positioning structures 112a are illustrated) and at least one first positioning structure 112b (two first positioning structures 112b are illustrated), and the first positioning structures 112a and the first positioning structures 112b are, for example, positioning holes. The assembling structure 130 is disposed on the cover 120, and the main body 110 and the cover 120 can be assembled through the assembling structure 130.

In detail, the assembling structure 130 includes a sliding component 132a, a sliding component 132b, at least one second positioning structure 134a (two second positioning structures 134a are illustrated) and at least one second positioning structure 134b (two second positioning structures 134b are illustrated), an elastic component 136a and an elastic component 136b. The sliding component 132a is slidably disposed on the cover 120 along a first axis A1 and has a pressing portion P, the sliding component 132b is slidably disposed on the cover 120 along a first axis A1' and has a pressing portion P'. The second positioning structures 134a and the second positioning structures 134b are respectively connected to the sliding component 132a and the sliding component 132b and are respectively aligned to the first positioning structures 112a and the first positioning structures 112b. The second positioning structures 134a and the second positioning structures 134b are, for example, positioning posts adapted to be inserted into the corresponding positioning holes. The elastic component 136a and the elastic component 136b are connected to the cover 120 and are respectively connected to the sliding component 132a and the sliding component 132b.

Figure 4A:
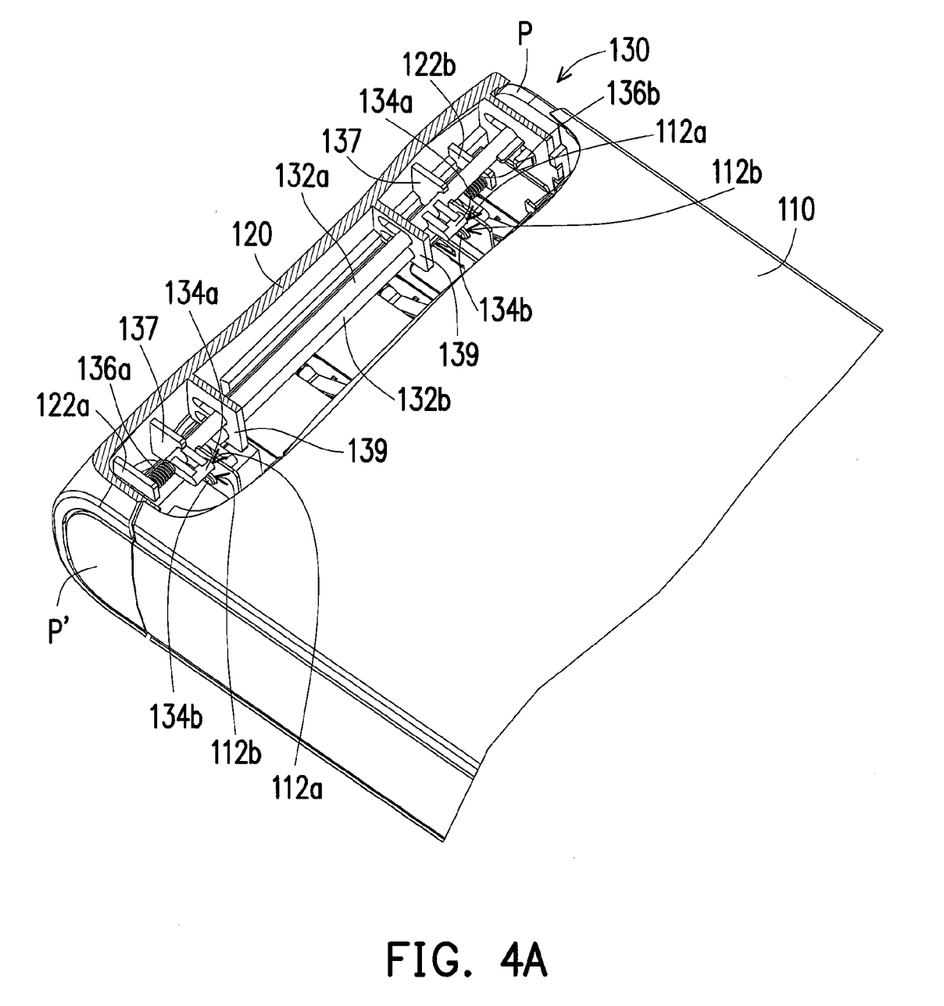
FIG. 4A illustrates a situation that second positioning structures of FIG. 2 are positioned at first positioning structures.
Figure 4B:
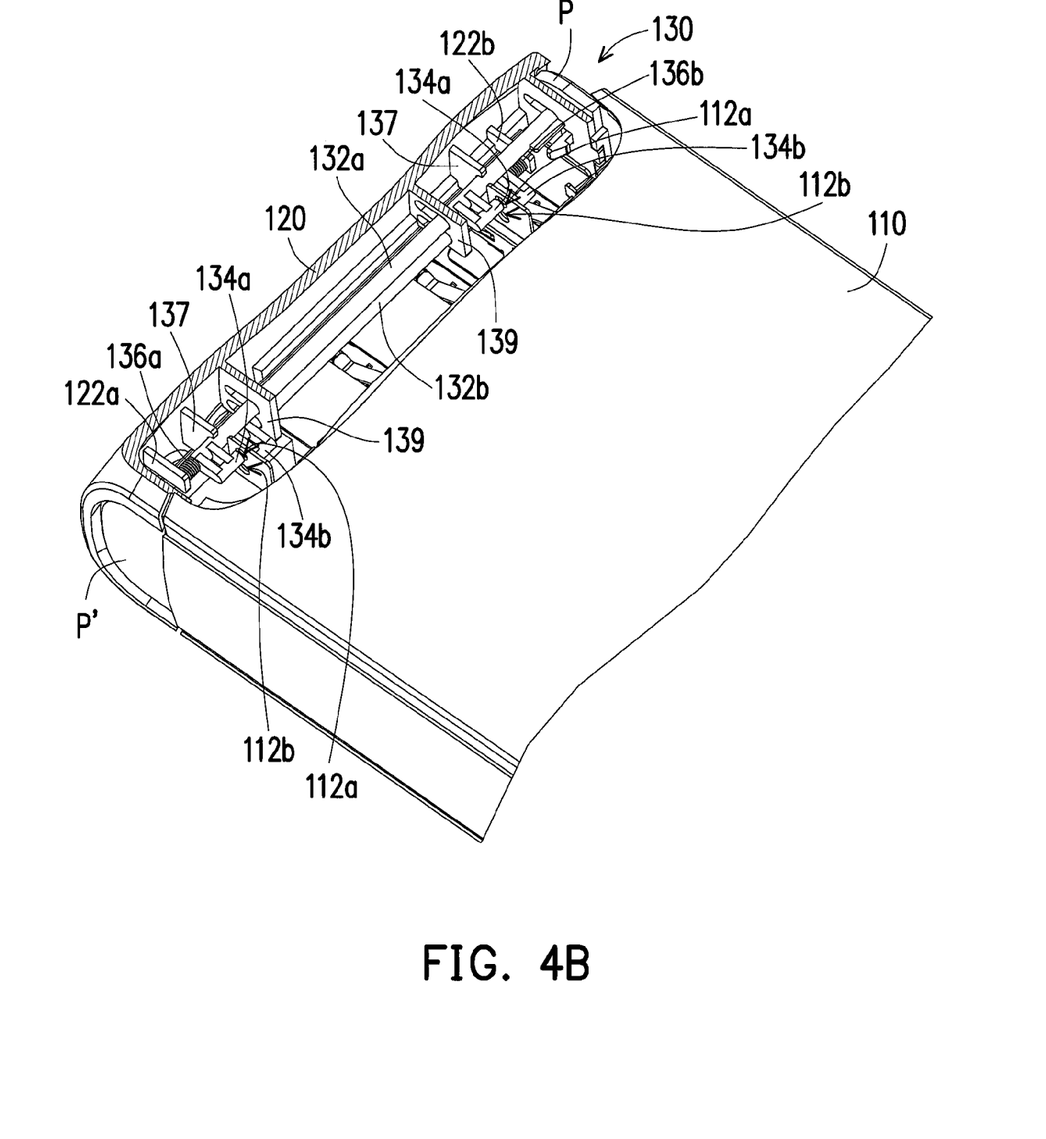
FIG. 4B illustrates a situation that second positioning structures of FIG. 2 are moved away from the first positioning structures.

FIG. 4A illustrates a situation that the second positioning structures of FIG. 2 are positioned at the first positioning structures. FIG. 4B illustrates a situation that the second positioning structures of FIG. 2 are moved away from the first positioning structures. As shown in FIG. 4A, when the cover 120 is assembled to the main body 110, the second positioning structures 134a are positioned at the corresponding first positioning structures 112a by an elastic force of the corresponding elastic component 136a, and the second positioning structures 134b are positioned at the corresponding first positioning structures 112b by an elastic force of the corresponding elastic component 136b, so as to stop the cover 120 separating from the main body 110. As shown in FIG. 4B, when the pressing portion P and the pressing portion P' bear forces at the same time to drive the second positioning structures 134a and the second positioning structures 134b to respectively move away from the first positioning structures 112a and the first positioning structures 112b, the cover 120 is adapted to separate from the main body 110 along a second axis A2 perpendicular to the first axis A1 and the first axis A1' shown in FIG. 2.

Under the above configuration, the user can respectively move the second positioning structures 134a and the second positioning structures 134b away from the first positioning structures 112a and the first positioning structures 112b by only pressing the pressing portion P on the sliding component 132a and the pressing portion P' on the sliding component 132b at the same time, so as to conveniently disassemble the cover 120. When the user unintentionally presses the pressing portion P, only the second positioning structures 134a are moved away from the corresponding first positioning structures 112a without moving the second positioning structures 134b away from the corresponding first positioning structures 112b. Similarly, when the user unintentionally presses the pressing portion P', only the second positioning structures 134b are moved away from the corresponding first positioning structures 112b without moving the second positioning structures 134a away from the corresponding first positioning structures 112a. In this way, the cover 120 is effectively prevented from being unexpectedly dissembled to cause danger.

Figure 5:
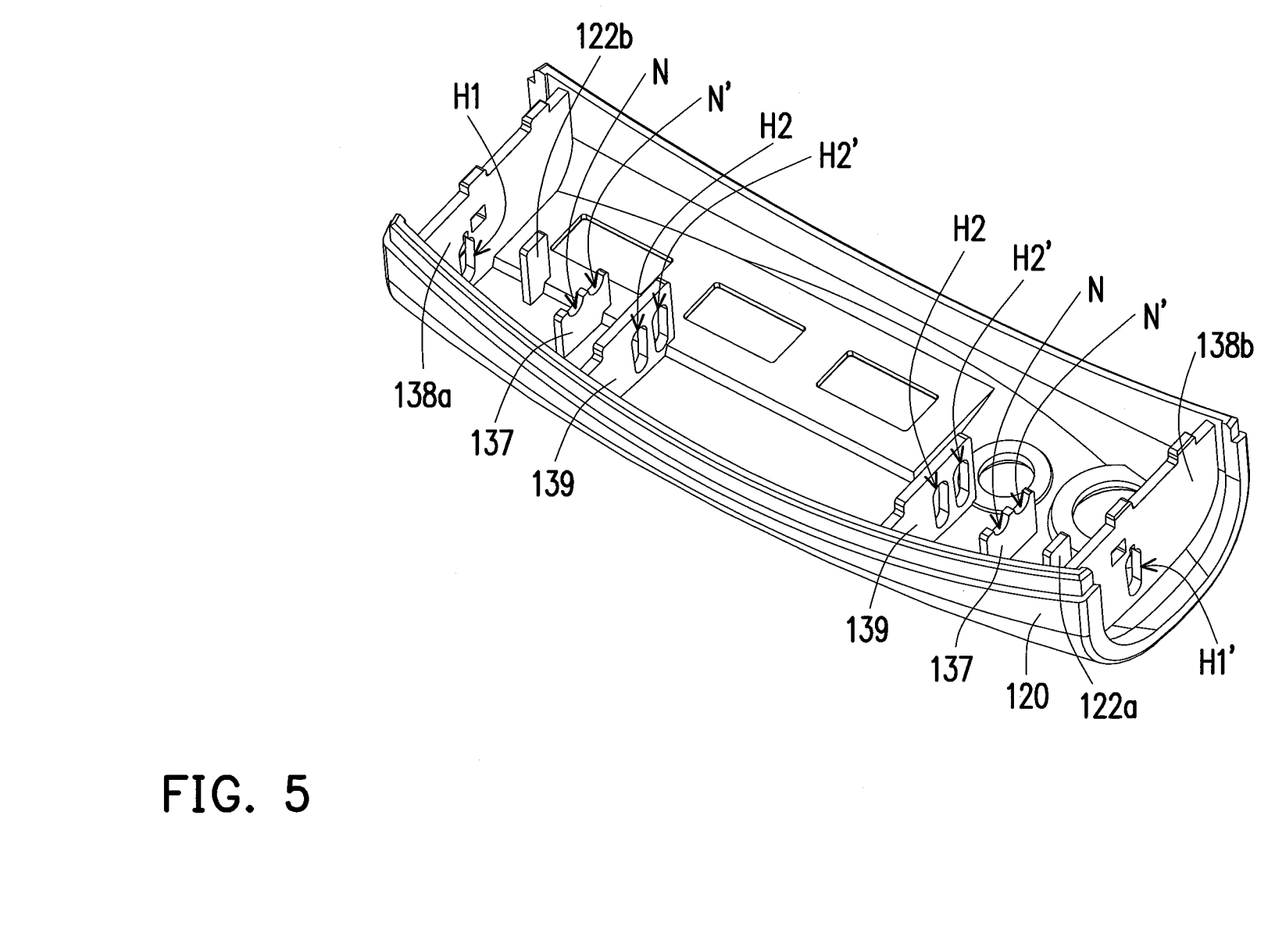
FIG. 5 is a three-dimensional view of the cover and a part of the assembling structure of FIG. 3.

FIG. 5 is a three-dimensional view of the cover and a part of the assembling structure of FIG. 3. Referring to FIG. 3 and FIG. 5, in the present embodiment, the assembling structure 130 further includes a first rib plate 138a, a first rib plate 138b, at least one second rib plate 137 (two second rib plates are illustrated) and at least one third rib plate 139 (two third rib plates are illustrated). The first rib plate 138a is connected to the cover 120 and has a first opening H1, and the first rib plate 138b is connected to the cover 120 and has a first opening H1'. Each of the second rib plates 137 has a notch N and a notch N', and the notch N and the notch N' are respectively aligned to the first opening H1 and the first opening H1'. Each of the third rib plates 139 has a second opening H2 and a second opening H2', and the opening H2 and the second opening H2' are respectively aligned to the first opening H1 and the first opening H1'. The first axis A1 (illustrated in FIG. 3) passes through the first opening H1, the notch N and the second opening H2, and the first axis A1' (illustrated in FIG. 3) passes through the first opening H1', the notch N' and the second opening H2'.

The sliding component 132a and the sliding component 132b respectively penetrate through the first opening H1 and the first opening H1', the sliding component 132a and the sliding component 132b are respectively limited at the notch N and the notch N', and the sliding component 132a and the sliding component 132b respectively penetrate through the second openings H2 and the second openings H2'. In other words, the sliding component 132a is slidably disposed on the cover 120 through the first opening H1 of the first rib plate 138a, the notch N of the second rib plate 137 and the second opening H2 of the third rib plate 139, and the sliding component 132b is slidably disposed on the cover 120 through the first opening H1' of the first rib plate 138b, the notch N' of the second rib plate 137 and the second opening H2' of the third rib plate 139.

Referring to FIG. 3 and FIG. 5, in the present embodiment, the cover 120 has a protrusion portion 122a and a protrusion portion 122b, and the protrusion portion 122a and the protrusion portion 122b are respectively aligned to the elastic component 136a and the elastic component 136b. The elastic component 136a is, for example, a compression spring compressed between the corresponding protrusion portion 122a and the corresponding sliding component 132a, and the elastic component 136b is, for example, a compression spring compressed between the corresponding protrusion portion 122b and the corresponding sliding component 132b. In other embodiments, the elastic component 136a and the elastic component 136b can be other suitable elastomers, which is not limited by the invention.

Figure 6:
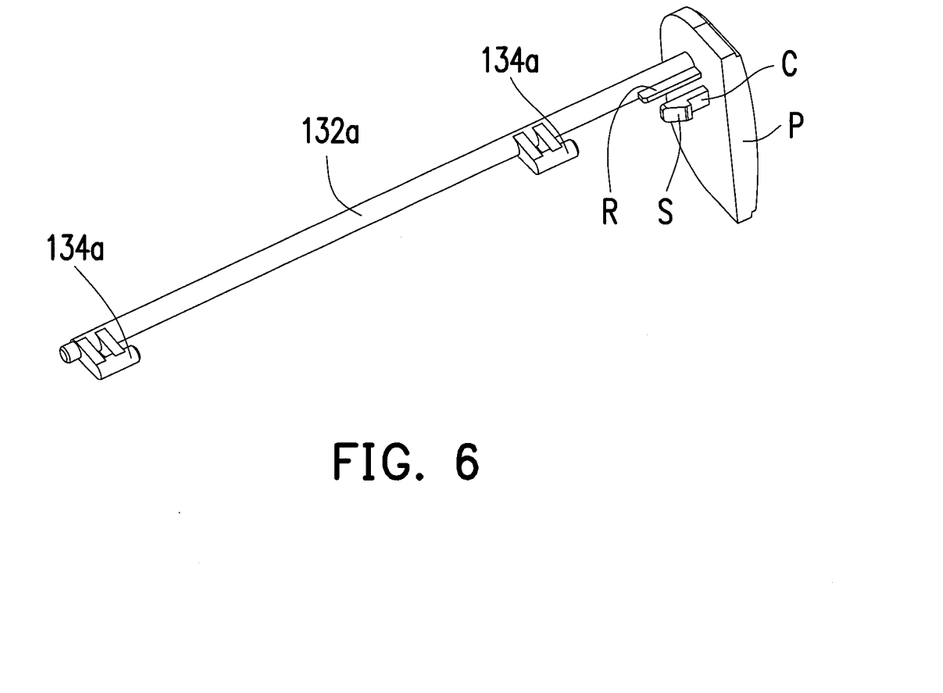
FIG. 6 is a three-dimensional view of a sliding component of FIG. 3.

FIG. 6 is a three-dimensional view of the sliding component of FIG. 3. Referring to FIG. 3 and FIG. 6, the sliding component 132a of the present embodiment has a stop portion S, where the stop portion S is, for example, a hook and is connected to the pressing portion P through a connection portion C. A distance between the stop portion S and the pressing portion P is greater than a thickness of the first rib plate 138a, and the first rib plate 138a is located between the stop portion S and the pressing portion P as that shown in FIG. 3 to limit a moving range of the sliding component 132a along the first axis A1, so as to prevent the sliding component 132a from separating from the cover 120. Moreover, a moving range of the sliding component 132b along the first axis A1' can also be limited through a similar structure and method, which is not repeated.

Figure 7:
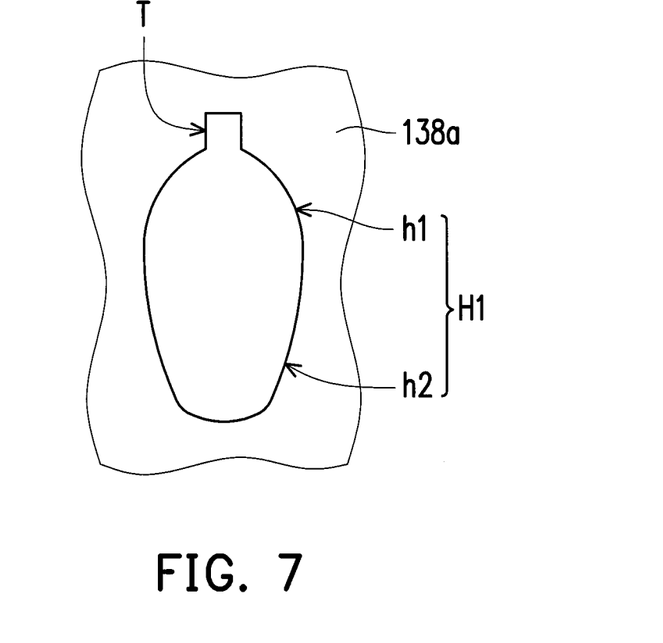
FIG. 7 is a partial schematic diagram of a first opening of a first rib plate of FIG. 3.

FIG. 7 is a partial schematic diagram of the first opening of the first rib plate of FIG. 3. The first rib plate 138a of the present embodiment has an orientation slot T shown in FIG. 7, where the orientation slot T is connected to the first opening H1, and the sliding component 132a has an orientation ridge R shown in FIG. 6. When the sliding component 132a penetrates through the first opening H1 of the first rib plate 138a along the first axis A1 as that shown in FIG. 3, the orientation ridge R is engaged to the orientation slot T to prevent unexpected rotation of the sliding component 132a along the first axis A1. Moreover, unexpected rotation of the sliding component 132b along the first axis A1' can be prevented through a similar structure and method, which is not repeated.

Figure 8:
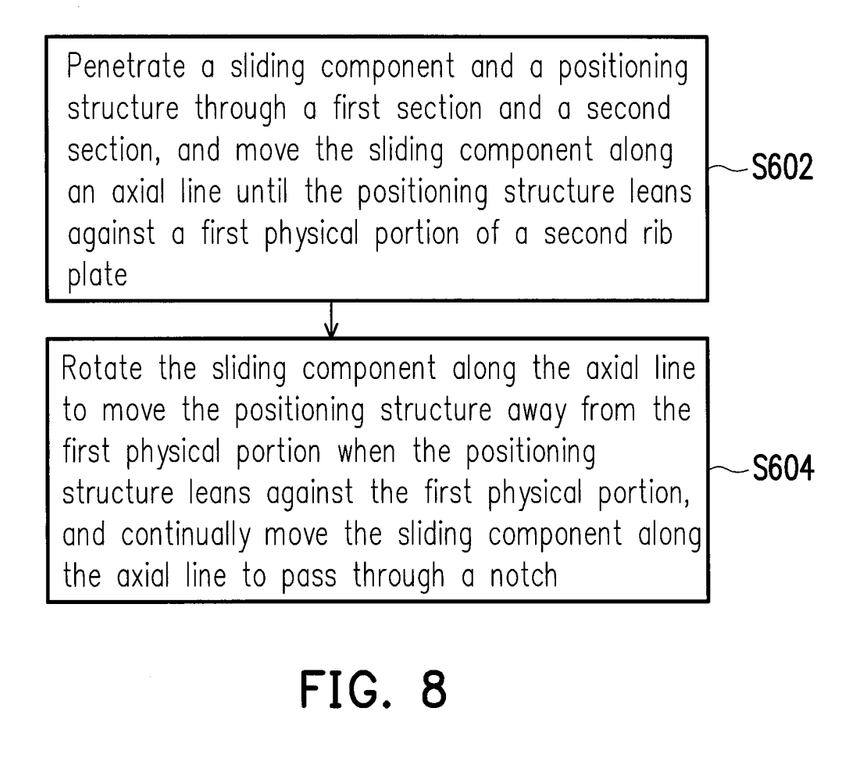
FIG. 8 is a flowchart illustrating an assembling method for assembling the sliding component of FIG. 6 to the cover of FIG. 5.
Figure 9A:
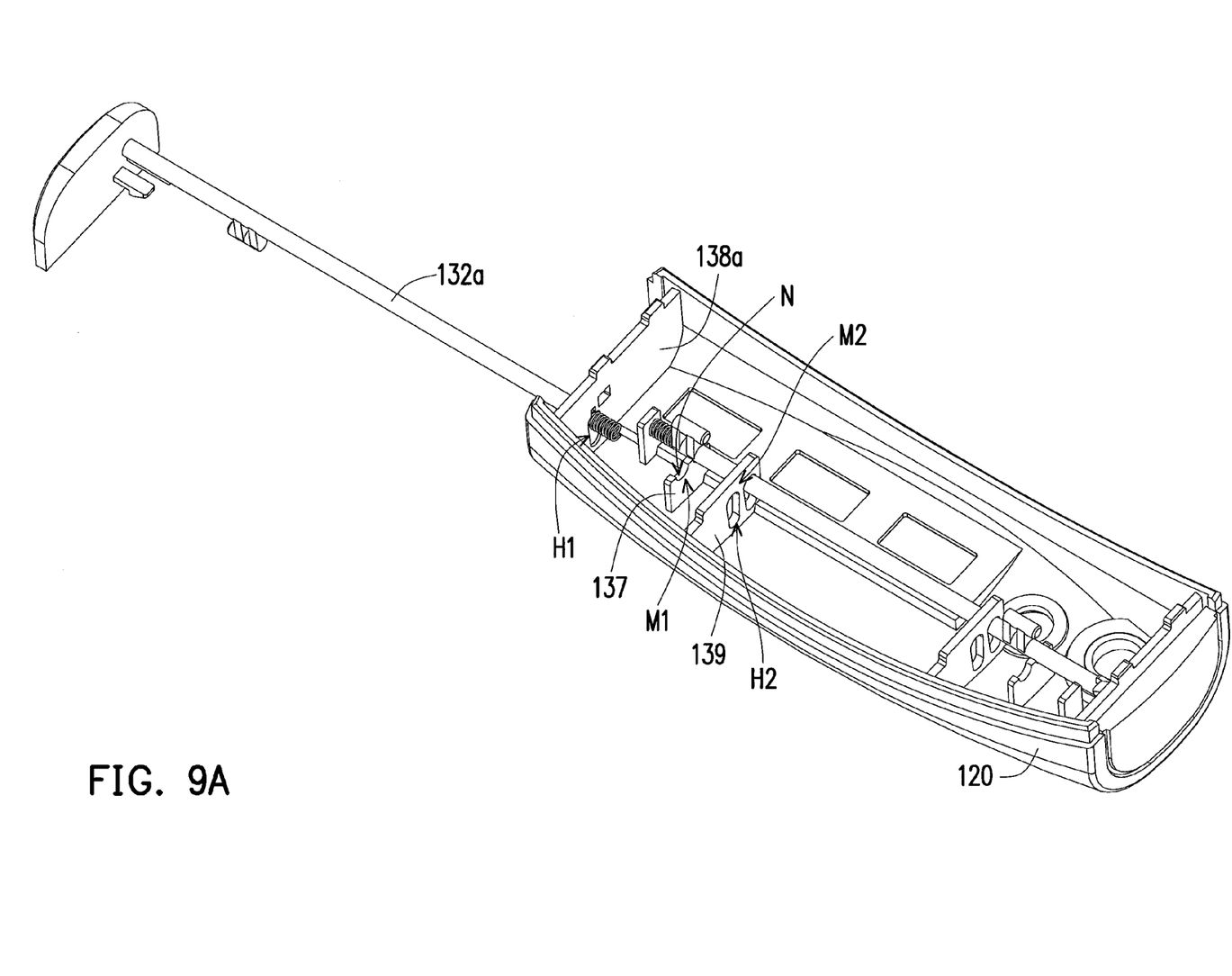
FIG. 9A to FIG. 9D illustrates assembling steps of FIG. 8.
Figure 9B:
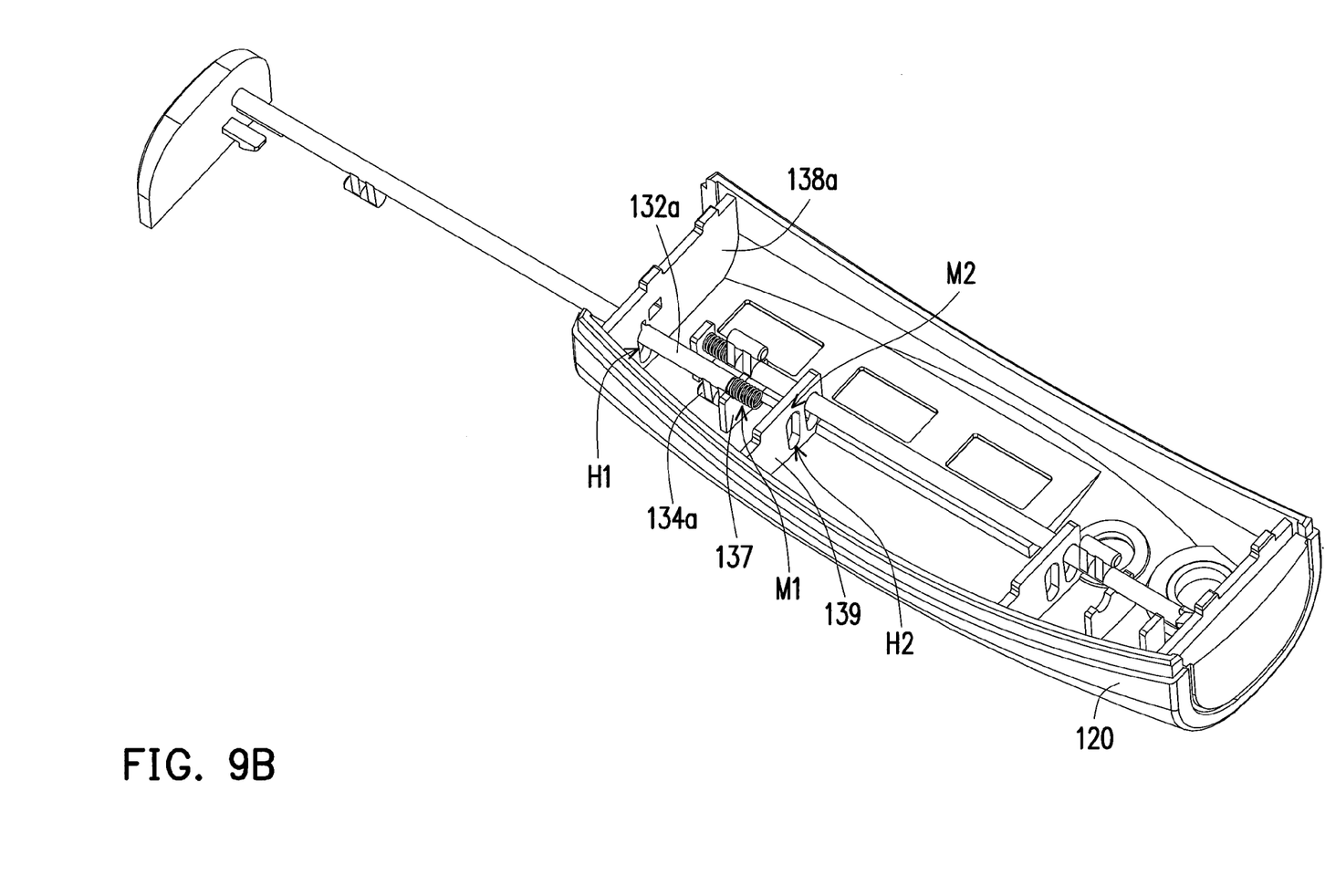
Figure 9C:
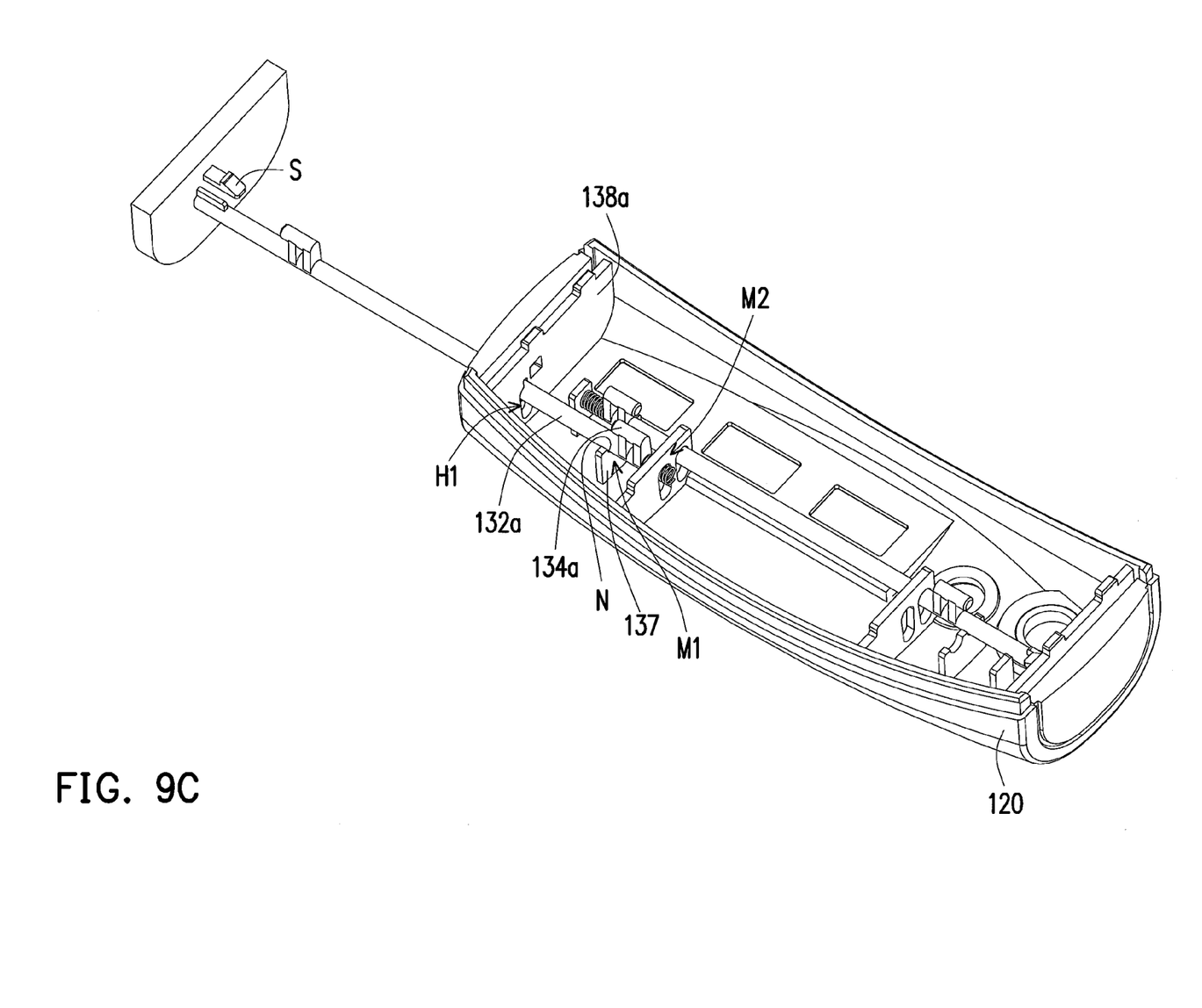

A method for assembling the sliding component 132a shown in FIG. 6 to the cover 120 shown in FIG. 5 is described below with reference of figures. FIG. 8 is a flowchart illustrating an assembling method for assembling the sliding component of FIG. 6 to the cover of FIG. 5. FIG. 9A to FIG. 9D illustrates assembling steps of FIG. 8. Referring to FIG. 8, first, as shown in FIG. 9A to FIG. 9B, the sliding component 132a and the positioning structure (i.e. the aforementioned second positioning structure 134a) are passed through the first opening H1, and the sliding component 132a is moved along the axis (i.e. the aforementioned first axis A1) until the positioning structure leans against a first physical entity M1 of the second rib plate 137 (step S602). When the positioning structure leans against the first physical entity M1, the sliding component 132a is rotated along the axis to move the positioning structure away from the first physical entity M1, as that shown in FIG. 9C, and the sliding component 132a is continually moved along the axis to pass through the notch N (step S604).

Figure 9D:
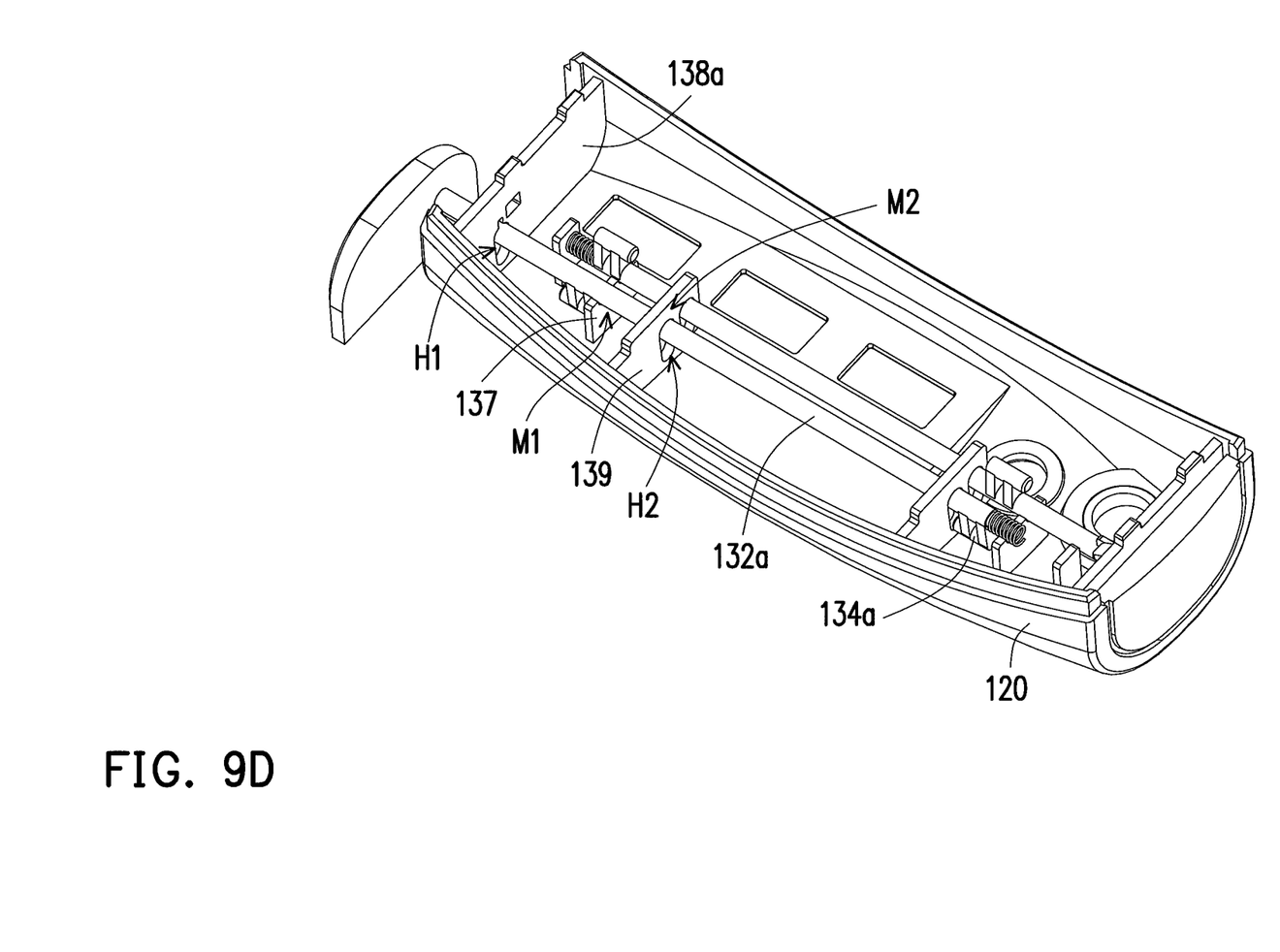

The aforementioned assembling method further includes a following step. When the sliding component 132a passes through the notch N and leans against a second physical entity M2 of the third rib plate 139 as that shown in FIG. 9C, as shown in FIG. 9D, the sliding component 132a is rotated along the axis, such that the positioning structure is moved away from the second physical entity M2 and is aligned to the second opening H2, and the sliding component 132a is continually moved along the axis, such that the sliding component 132a and the positioning structure pass through the second opening H2. Moreover, according to a similar assembling process, the other positioning structure of the sliding component 132a and the two positioning structures of the sliding component 132b can be moved away from the physical entities of the rib plates by rotating the sliding components, such that the sliding component 132a and the sliding component 132b can be smoothly assembled to a state shown in FIG. 3.

Referring to FIG. 7, in the present embodiment, the first opening H1 includes a first section h1 and a second section h2 connected to each other, the first axis A1 passes through the first section h1, and the first section h1 and the second section h2 are respectively penetrated by the sliding component 132a and the second positioning structure 134a. An outer diameter of the first section h1 is greater than or equal to an outer diameter of the sliding component 132a shown in FIG. 3, and an outer diameter of the second section h2 is smaller than the outer diameter of the sliding component 132a shown in FIG. 3 and is greater than or equal to an outer diameter of the second positioning structure 134a. In this way, it is guaranteed that the sliding component 132a is not assembled in a wrong way by penetrating through the second section h2. Moreover, it is also guaranteed that the sliding component 132b is not assembled in the wrong way according to a similar structure and method, which is not repeated.

In summary, in the electronic device of the invention, the main body has two first positioning structures, the assembling structure has two second positioning structures, and the two second positioning structures are adapted to be simultaneously positioned at the two first positioning structures to assemble the cover to the main body. The user is capable of moving the two second positioning structures away from the two first positioning structures by only pressing the two pressing portions on the two sliding components at the same time, so as to conveniently disassemble the cover. Moreover, when the user unintentionally presses one of the two pressing portions, only one of the two second positioning structures is moved away from the corresponding first positioning structure without moving the other second positioning structure away from the corresponding first positioning structure, by which the cover is effectively prevented from being unexpectedly dissembled to cause danger.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An electronic device, comprising:
   a main body, having at least two first positioning structures;
   a cover; and
   an assembling structure, comprising:
   two sliding components, wherein each of the sliding components is slidably disposed on the cover and has a pressing portion;
   at least two second positioning structures, respectively connected to the two sliding components and respectively aligned to the two first positioning structures; and
   two elastic components, connected to the cover and respectively connected to the two sliding components, wherein each of the second positioning structures is positioned at the corresponding first positioning structure by an elastic force of the corresponding elastic component, so as to stop the cover separating from the main body, and when the two pressing portions bear forces at the same time to drive the two second positioning structures to respectively move away from the two first positioning structures, the cover is adapted to separate from the main body
   wherein the cover has two protrusion portions, the two protrusion portions are respectively aligned to the two elastic components, and each of the elastic components is compressed between the corresponding protrusion portion and the corresponding sliding component.

2. The electronic device as claimed in claim 1, wherein each of the sliding components is slidably disposed on the cover along a first axis, the cover is adapted to separate from the main body along a second axis, and the first axis is perpendicular to the second axis.

3. The electronic device as claimed in claim 1, wherein each of the first positioning structures is a positioning hole, and each of the second positioning structures is a positioning post.

4. The electronic device as claimed in claim 1, wherein the assembling structure further comprises two first rib plates, each of the first rib plates is connected to the cover and has a first opening, and the two sliding components respectively penetrate through the two first openings.

5. The electronic device as claimed in claim 4, wherein the assembling structure further comprises at least one second rib plate, the second rib plate has two notches, the two notches are respectively aligned to the two first openings, and the two sliding components are respectively limited at the two notches.

6. The electronic device as claimed in claim 4, wherein the assembling structure further comprises at least one third rib plate, the third rib plate has two second openings, the two second openings are respectively aligned to the two first openings, and the two sliding components respectively penetrate through the two second openings.

7. The electronic device as claimed in claim 4, wherein each of the first openings comprises a first section and a second section connected to each other, an outer diameter of the first section is greater than or equal to an outer diameter of each of the sliding components, and an outer diameter of the second section is smaller than the outer diameter of each of the sliding components and is greater than or equal to an outer diameter of each of the second positioning structures.

8. The electronic device as claimed in claim 4, wherein each of the sliding components has a stop portion, a distance between the stop portion and the pressing portion is greater than a thickness of the first rib plate, and the first rib plate is located between the stop portion and the pressing portion to limit a moving range of the sliding component.

9. The electronic device as claimed in claim 4, wherein each of the sliding components penetrates through the first opening along a first axis, each of the first rib plates has an orientation slot, the orientation slot is connected to the first opening, each of the sliding components has an orientation ridge, and the orientation ridge is engaged to the orientation slot to stop rotation of the sliding component along the first axis.

10. An assembling structure, adapted to an electronic device comprising a main body, wherein the main body has at least two first positioning structures, the assembling structure comprising:
    a cover;
    two sliding components, slidably disposed on the cover and each having a pressing portion;
    at least two second positioning structures, respectively connected to the two sliding components and respectively aligned to the two first positioning structures; and
    two elastic components, connected to the cover and respectively connected to the two sliding components, wherein each of the second positioning structures is positioned at the corresponding first positioning structure by an elastic force of the corresponding elastic component, so as to stop the cover separating from the main body, when the two pressing portions bear forces at the same time to drive the two second positioning structures to respectively move away from the two first positioning structures, the cover is adapted to separate from the main body
    wherein the cover has two protrusion portions, the two protrusion portions are adapted to be respectively aligned to the two elastic components, and each of the elastic components is adapted to be compressed between the corresponding protrusion portion and the corresponding sliding component.

11. The assembling structure as claimed in claim 10, wherein each of the sliding components is slidably disposed on the cover along a first axis, the cover is adapted to separate from the main body along a second axis, and the first axis is perpendicular to the second axis.

12. The assembling structure as claimed in claim 10, wherein each of the first positioning structures is a positioning hole, and each of the second positioning structures is a positioning post.

13. The assembling structure as claimed in claim 10, further comprising two first rib plates, wherein each of the first rib plates is connected to the cover and has a first opening, and the two sliding components respectively penetrate through the two first openings.

14. The assembling structure as claimed in claim 13, further comprising at least one second rib plate, wherein the second rib plate has two notches, the two notches are respectively aligned to the two first openings, and the two sliding components are respectively limited at the two notches.

15. The assembling structure as claimed in claim 13, further comprising at least one third rib plate, wherein the third rib plate has two second openings, the two second openings are respectively aligned to the two first openings, and the two sliding components respectively penetrate through the two second openings.

16. The assembling structure as claimed in claim 13, wherein each of the first openings comprises a first section and a second section connected to each other, an outer diameter of the first section is greater than or equal to an outer diameter of each of the sliding components, and an outer diameter of the second section is smaller than the outer diameter of each of the sliding components and is greater than or equal to an outer diameter of each of the second positioning structures.

17. The assembling structure as claimed in claim 13, wherein each of the sliding components has a stop portion, a distance between the stop portion and the pressing portion is greater than a thickness of the first rib plate, and the first rib plate is located between the stop portion and the pressing portion to limit a moving range of the sliding component.

18. The assembling structure as claimed in claim 13, wherein each of the sliding components penetrates through the first opening along a first axis, each of the first rib plates has an orientation slot, the orientation slot is connected to the first opening, each of the sliding components has an orientation ridge, and the orientation ridge is engaged to the orientation slot to stop rotation of the sliding component along the first axis.

19. An assembling method, adapted to assemble a sliding component to a cover, wherein a first rib plate is connected to the cover and has a first opening, a second rib plate is connected to the cover and has a notch, a positioning structure is connected to the sliding component, and an axis passes through the first opening and the notch, the assembling method comprising:
    penetrating the sliding component and the positioning structure through the first opening, and moving the sliding component along the axis until the positioning structure leans against a first physical entity of the second rib plate; and
    rotating the sliding component along the axis to move the positioning structure away from the first physical portion when the positioning structure leans against the first physical portion, and continually moving the sliding component along the axis to pass through the notch.

20. The assembling method as claimed in claim 19, wherein a third rib plate is connected to the cover and has a second opening, the axis passes through the second opening, and the assembling method further comprises:
    when the sliding component passes through the notch and leans against a second physical entity of the third rib plate, rotating the sliding component along the axis so that the positioning structure moves away from the second physical entity and is aligned to the second opening, and continually moving the sliding component along the axis so that the sliding component and the positioning structure pass through the second opening.

* * * * *